US011901355B2

(12) United States Patent
Noebauer et al.

(10) Patent No.: US 11,901,355 B2
(45) Date of Patent: *Feb. 13, 2024

(54) SEMICONDUCTOR DEVICE HAVING A MAIN TRANSISTOR, A SENSE TRANSISTOR, AND A BYPASS DIODE STRUCTURE

(71) Applicant: Infineon Technologies Austria AG, Villach (AT)

(72) Inventors: Gerhard Noebauer, Villach (AT); Florian Gasser, Moosburg (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 18/085,756

(22) Filed: Dec. 21, 2022

(65) Prior Publication Data
US 2023/0120226 A1 Apr. 20, 2023

Related U.S. Application Data

(63) Continuation of application No. 16/866,918, filed on May 5, 2020, now Pat. No. 11,574,904.

(30) Foreign Application Priority Data

May 6, 2019 (EP) .................................. 19172820

(51) Int. Cl.
*H01L 21/00* (2006.01)
*H01L 27/06* (2006.01)
*H01L 29/06* (2006.01)
*H01L 29/78* (2006.01)

(52) U.S. Cl.
CPC ...... *H01L 27/0629* (2013.01); *H01L 29/0646* (2013.01); *H01L 29/0696* (2013.01); *H01L 29/7815* (2013.01)

(58) Field of Classification Search
CPC ............. H01L 27/0629; H01L 29/0646; H01L 29/0696; H01L 29/7815
See application file for complete search history.

(56) References Cited

U.S. PATENT DOCUMENTS

| 7,939,882 B2 | 5/2011 | Su et al. |
| 11,574,904 B2 * | 2/2023 | Noebauer ........... H01L 29/7813 |
| 2015/0014687 A1 | 1/2015 | Nakajima |
| 2016/0211361 A1 | 7/2016 | Nishimura |
| 2017/0322239 A1 | 11/2017 | Shibib et al. |
| 2018/0047721 A1 | 2/2018 | Nishimura |

FOREIGN PATENT DOCUMENTS

DE 19958234 A1 6/2001

* cited by examiner

*Primary Examiner* — Richard A Booth
(74) *Attorney, Agent, or Firm* — Murphy, Bilak & Homiller, PLLC

(57) ABSTRACT

In an embodiment, a semiconductor device includes: a main transistor having a load path; a sense transistor configured to sense a main current flowing in the load path of the main transistor; and a bypass diode structure configured to protect the sense transistor and electrically coupled in parallel with the sense transistor. A sense transistor cell of the sense transistor includes a sense trench and a sense mesa. The sense trench and a bypass diode trench of the bypass diode structure form a common trench. The sense mesa and a bypass diode mesa of the bypass diode structure form a common mesa.

20 Claims, 6 Drawing Sheets

US 11,901,355 B2

SEMICONDUCTOR DEVICE HAVING A MAIN TRANSISTOR, A SENSE TRANSISTOR, AND A BYPASS DIODE STRUCTURE

BACKGROUND

Transistors used in power applications are typically fabricated using silicon (Si) semiconductor materials. Common transistor devices for power applications include Si CoolMOS® transistors, Si Power MOSFETs, and Si Insulated Gate Bipolar Transistors (IGBTs).

For some power applications, it is desirable to measure the current in a power supply in order to provide fault detection and/or protection, current mode control voltage regulation, or current control, for example. One system to measure current in a power supply uses a field effect transistor (FET) which is commonly referred to as a sense FET. The sense field effect transistor is a small field effect transistor which is separate from the main power field effect transistor. The sense field effect transistor is generally configured to produce a voltage corresponding to the current in the main field effect transistor in order to provide current sensing and may be integrated into the same semiconductor body as the main field effect transistor.

US 2017/0322239 A1 discloses an example of a vertical trench semiconductor device with a split gate structure that includes a main field effect transistor and a current sensing field effect transistor that is configured to produce voltage corresponding to a drain source current of the main field effect transistor.

However, further improvements to provide more accurate and reliable current sensing in transistor devices including a current sensing functionality are desirable.

SUMMARY

In some embodiments, a semiconductor device comprises a main transistor having a load path, a sense transistor for sensing a main current flowing in the load path of the main transistor and at least one bypass diode structure for protecting the sense transistor. The at least one bypass diode structure is electrically coupled in parallel with the sense transistor.

In some embodiments, the main transistor comprises a main drain, a main source and a main gate and the sense transistor comprises a sense drain, a sense source and a sense gate, wherein the main drain and the sense drain are electrically coupled to one another and the main gate and the sense gate are electrically coupled to one another.

In some embodiments, the at least one bypass diode structure is electrically coupled between the sense drain and the sense source.

In some embodiments, the main transistor comprises a plurality of main transistor cells, each main transistor cell comprising a-main trench and a main mesa, each main trench comprising a main gate electrode and each main mesa comprising a main source region arranged on a main body region, and the sense transistor comprises a plurality of sense transistor cells, each sense transistor cell comprising a sense trench and a sense mesa, each sense trench comprising a sense gate electrode and each sense mesa comprising a sense source region arranged on a sense body region, wherein the sense source region is electrically isolated from the main source region.

In some embodiments, the bypass diode structure comprises a plurality of bypass diode trenches and a plurality of bypass diode mesas, each bypass diode mesa comprising a bypass body region that is coupled to the sense source region of the sense transistor, wherein the bypass body region extends to the upper surface of the bypass diode mesa.

In some embodiments, the bypass body region and the sense source region are electrically coupled to a common metal layer by one or more conductive vias.

In some embodiments, a contact area between the bypass body region and the common metal layer is greater than a contact area between the source sense region and the common metal layer.

In some embodiments, the sense trench and the bypass diode trench form a common trench and the sense mesa and the bypass diode mesa form a common mesa.

In some embodiments, an elongate conductive via is positioned in the common mesa and is positioned in the sense source region and in the bypass body region to electrically couple the bypass body region and the sense source region to the common metal layer.

In some embodiments, the elongate conductive via extends laterally into the bypass body region by a distance of at least 10 µm.

In some embodiments, the sense trenches extend to a gate runner and the gate electrodes of the sense trenches are coupled to the gate runner.

In some embodiments, the bypass diode structure is laterally arranged between the sense transistor and the gate runner.

In some embodiments, the common metal layer forms a source sense runner that laterally extends between the sense transistor and a sense pad and electrically couples the sense source region and the bypass body region to the sense pad.

In some embodiments, at least one bypass diode structure is arranged under the sense source runner and/or at least one bypass diode structure is arranged under the sense pad.

In some embodiments, the main trenches and the sense trenches each further comprise a field plate that is electrically isolated from the first electrode.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

Figure 1:
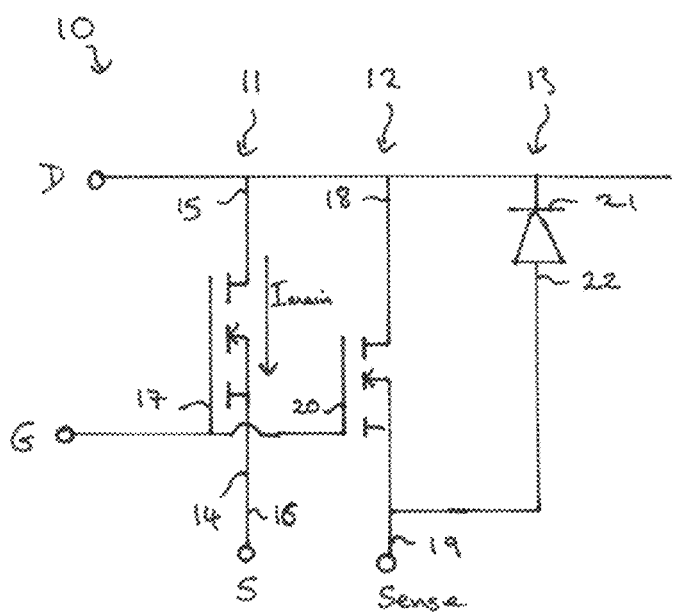
FIG. 1 illustrates a circuit diagram provided by a semiconductor device according to an embodiment, which includes a main transistor, a sense transistor and a bypass diode structure.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized, and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Some applications, such as high performance synchronous buck converters in server applications, demand a highly accurate monitoring of the output current, such as an accuracy of better than 2% over wide load ranges, as the detected signal is used for the control of the system, for example to optimize the computing power of a CPU which is connected to the output in the case of server applications.

Ideally, losses should be as low as possible to keep temperatures and the energy consumption at a minimum, so that solutions such as external shunt resistors or increasing the resistance of inductors in the output path to improve the accuracy of the measurement are no longer sufficient. Instead, the current signal is provided from the integrated buck converter (the 'power stage') directly. This may be achieved by using a current mirror that is integrated in the power MOSFET or MOSFETs of the power stage. The control circuitry for the current mirror may be integrated in the driver IC of the power stage.

A current mirror on a power transistor, such as a power MOSFET, may include an embedded sense transistor that is coupled in parallel with the power switch, i.e. the main transistor carrying the load path of the power stage. Commonly, in a current mirror both the main and sense transistors share the same drain potential and gate potential. The source potential at the main transistor is sensed at a representative location, reproduced by circuitry in the (driver) IC and applied to the source terminal of the sense transistor. In an equilibrium state, the potentials are matched and ideally, the currents in the power MOSFET and the sense MOSFET scale by the active area. As the sense transistor is substantially laterally smaller in size than the power transistor, the sense current is smaller and can be measured in the IC. A voltage or current signal scaling linearly with load current is put to an output pin of the integrated power stage for further processing on the application board.

Since the sense transistor is coupled in parallel with the load path, it creates some losses, which also scale with area. As a consequence, the sense transistor should in principle be as small as possible, which also helps keep the IC size small as it has to process lower currents. Typical ranges are in the order of 1:40000, i.e. a load current of $I_L$=40 A in the main transistor creates a sense current of $I_S$=1 mA in the sense transistor. The acronym KILIS ($K=I_L/I_S$) is sometimes used for the current ratio. In this example, KILIS=40000.

Due to the small dimensions of the sense transistor (typically less than 100 $\mu m^2$), it has been observed that the sense transistor may turn on spuriously at high drain-to-source voltages. Such a condition can lead to Hot-Carrier-Stress potentially changing the characteristics of the sense transistor leading to errors in the current measurement. Also, due to the small size, the sense transistor is relatively sensitive to ESD events if exposed to the outside.

In order to mitigate or even overcome these issues, embodiments described herein provide a semiconductor device including a main transistor, a sense transistor and at least one bypass diode structure for protecting the sense transistor. The bypass diode structure or structures are included with the aim of improving the ruggedness to unwanted turn-on and ESD events affecting the sense transistor.

In some embodiments, at least one diode structure is coupled in parallel with the sense transistor. This diode structure has properties as similar as possible to the sense transistor but no MOSFET channel. This additional diode structure or structures provides, firstly, a bypass for unwanted charges in order to avoid spurious turn-on, and secondly, additional area parallel to the sense transistor to improve avalanche ruggedness and as a consequence also the ESD rating.

Figure 2:
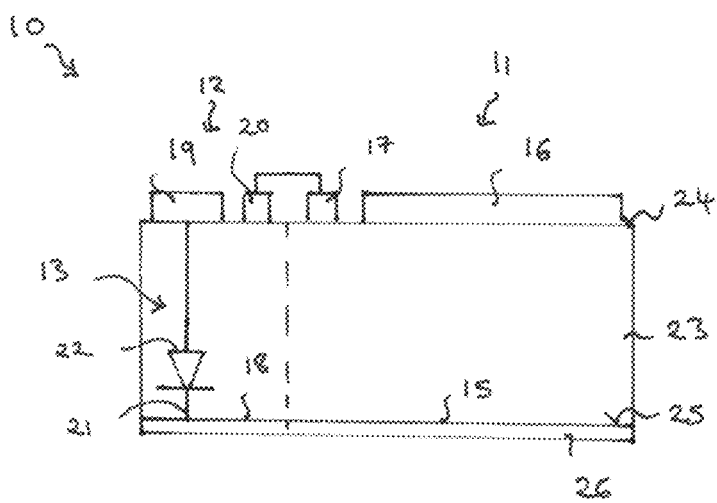
FIG. 2 illustrates a schematic diagram of a semiconductor device providing the circuit illustrated in FIG. 1.

FIG. 1 illustrates a circuit diagram provided by a semiconductor device 10 according to an embodiment. The semiconductor device 10 comprises a main transistor 11, a sense transistor 12 and a bypass diode structure 13. FIG. 2 illustrates a schematic diagram of the semiconductor device 10 providing the circuit illustrated in FIG. 1.

The main transistor 11 provides a power switch for switching load and has a load path 14. The sense transistor 12 is used for sensing a main current, $I_{main}$, flowing in the load path 14 of the main transistor 11. The sense transistor 12 is not connected in the load path 14, but parallel to the load path 14. The diode structure 13 is electrically coupled in parallel with the sense transistor 12 and provides a bypass diode structure for protecting the sense transistor 12.

The main transistor 11 comprises a main drain 15, a main source 16 and a main gate 17. The sense transistor 12 comprises a sense drain 18, a sense source 19 and a sense gate 20. The main drain 15 and the sense drain 18 are electrically coupled to one another and to the same drain potential D and the main gate 17 and the sense gate 20 are electrically coupled to one another and to the same gate potential G. The main source 16 and the sense source 19 are separate and electrically isolated from one another in order that the sense transistor 12 can provide current sensing for the main transistor 11. The bypass diode structure 13 is electrically coupled between the sense drain 18 and the sense source 19 so that the bypass diode 13 is electrically coupled in parallel with the sense transistor 12. In particular, the cathode 21 of the diode 13 is coupled to the sense drain 18 and the anode 22 of the diode 13 is connected to the sense source 19. The cathode 21 of the diode structure 13, the sense drain 18 and the main drain 15 are all coupled to the common drain potential D. In some embodiments two or more bypass diode structures are provided which are each coupled in parallel with the sense transistor 12.

As is schematically indicated in FIG. 2, the sense transistor 12 and one or more bypass diode structures 13 may be integrated into a common semiconductor body 23 along with the main transistor 11 to form the semiconductor device 10. The main transistor device 11 and the sense transistor device 12 may each be vertical transistor devices, for example vertical MOSFET devices in which the terminals for the main source 16, main gate 17, sense source 19 and sense gate 20 are arranged on a first surface 24 of the semiconductor body 23 and a common drain terminal 26, that is coupled to the main drain 15 and sense drain 18, is positioned on the opposing second surface 25 of the semiconductor body 23 such that the main transistor 11 and sense transistor 12 have a vertical drift path.

The one or more bypass diode structures 13 may have a transistor structure in which the gate is electrically coupled to the source to form the anode of the diode. Such structures are commonly referred to as gated MOSFETs.

In some embodiments, the sense transistor 12 is designed with similar design rules as the much larger power transistor 12 so that the sense transistor 12 matches the characteristics of the power transistor 11 and forms a good current mirror. The bypass diode structure 13 may also be designed with similar design rules for the main transistor 11 and sense transistor 12 and may be provided by a gated transistor structure, for example. In other embodiments the bypass diode structure or structures may comprise a pn diode.

The semiconductor device 10 may comprise a plurality of transistor cells. A majority of the cells are used to form the main transistor 11 and a small proportion of these transistor cells may be used to form the sense transistor 12 and the bypass diode structure 13. The transistor structure of the transistor cells may be a trench transistor structure, whereby the trenches may be columnar or elongate, e.g. strip-like. In embodiments in which the semiconductor device 10 including the main transistor 11, sense transistor 12 and at least one bypass diode structure 13 are based on an elongate trench transistor structure, the main transistor 11, sense transistor 12 and at least one bypass diode structure 13 may be formed laterally adjacent one another in different regions of a common elongate trench or common elongate trenches.

Figure 3:
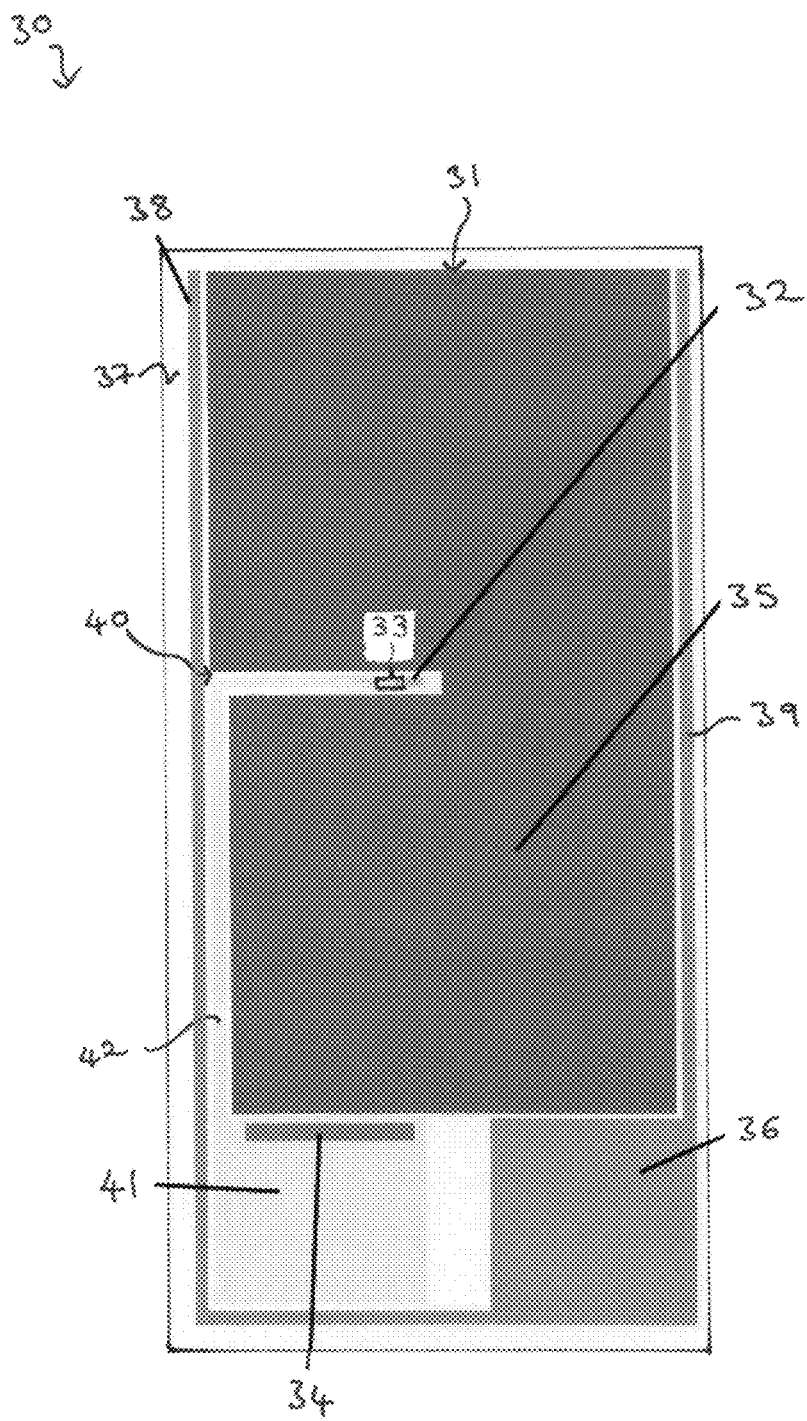
FIG. 3 illustrates a top view of a semiconductor device with a main transistor, a sense transistor and two bypass diode structures.

FIG. 3 illustrates a top view of a semiconductor device 30 which includes a main transistor device 31, a sense transistor 32, a first bypass diode structure 33 and a second bypass diode structure 34 connected to form the circuit illustrated in FIG. 1. However, the semiconductor device 30 may include fewer or more than 2 bypass diode structures which may have the same or different structures. In some embodiments, the semiconductor device 30 may include a single bypass diode structure and may include either the first diode structure 33 or the second diode structure 34 depending on the function that is required for a particular application.

The main transistor 31 includes a main source, main gate and main drain and the sense transistor 32 includes a sense source, a sense drain and a sense gate which are not illustrated in the top view of the semiconductor device 30 of FIG. 3.

The main transistor 31 includes a source pad 35 that is coupled to the main source and a gate pad 36 arranged on the upper surface 37 of the semiconductor device 30. The gate pad 36 is electrically coupled to the main gate and sense gate and is arranged in one corner of the upper surface 37 and extends into gate runners 38, 39 which extend in the peripheral region of three adjoining sides of the first surface 37. The gate pad 36 and gate runners 38, 39 are spaced apart and electrically insulated from the source pad 35. The gate pad 36 and the gate runners 38, 39 are electrically coupled to the main gate of the main transistor 31 and to the sense gate of the sense transistor 32.

The source pad 35 covers the majority of the first surface 37 and includes a gap or cutout portion 40 that extends from one side towards the centre of the first surface 37 so that the source pad 35 can be considered to have a U-shape. The sense transistor 32 and the first bypass diode structure 33 are arranged in the cutout 40 towards the centre of the first surface 37 and are spaced apart from the source pad 35.

A sense pad 41 is also arranged on the first surface 37 of the semiconductor device 30 and is positioned in the opposing corner of the first surface 37 from the gate pad 36. The sense pad 41 is electrically connected by a sense runner 42 to the source sense of the sense transistor 32. The sense runner 42 extends substantially parallel to the gate runner 38 and then perpendicularly to the gate runner 38 into the cutout 40 in order to electrically couple the sense pad 41 to the source sense of the sense transistor 32. The first bypass diode structure 33 is electrically coupled in parallel with the sense transistor 32 so that one terminal of bypass diode structure 33, in particular, the anode, is electrically coupled to the sense runner 42 and, therefore, to the sense source of the sense transistor.

The second bypass diode structure 34 is positioned under the sense pad 41 and includes an anode that is electrically coupled to the source pad 41. The sense pad 41 and the sense runner 42 are electrically isolated from the source pad 35 and from the gate pad 36 and gate runners 38, 39.

The layout of the main source pad 35, the sense pad 41, the gate pad 36, the sense runner 42 and gate runners 38, 39 on the first surface 37 is not limited to that illustrated in FIG. 3—other arrangements may be provided. For example, the sense pad 41 and gate pad 36 may be arranged in diagonally opposite corners of the first surface 37.

Figure 4:
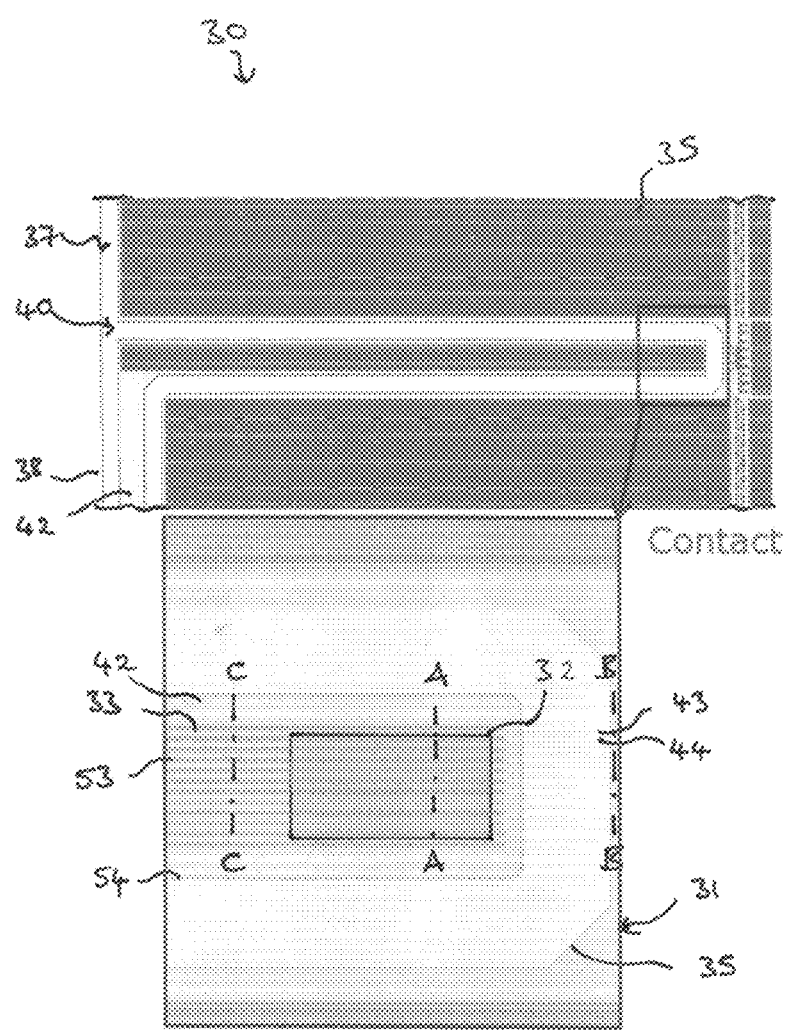
FIG. 4 illustrates an enlarged plan view of a first portion of the semiconductor device of FIG. 4 and illustrates the sense transistor and a first bypass diode structure.
Figure 5:
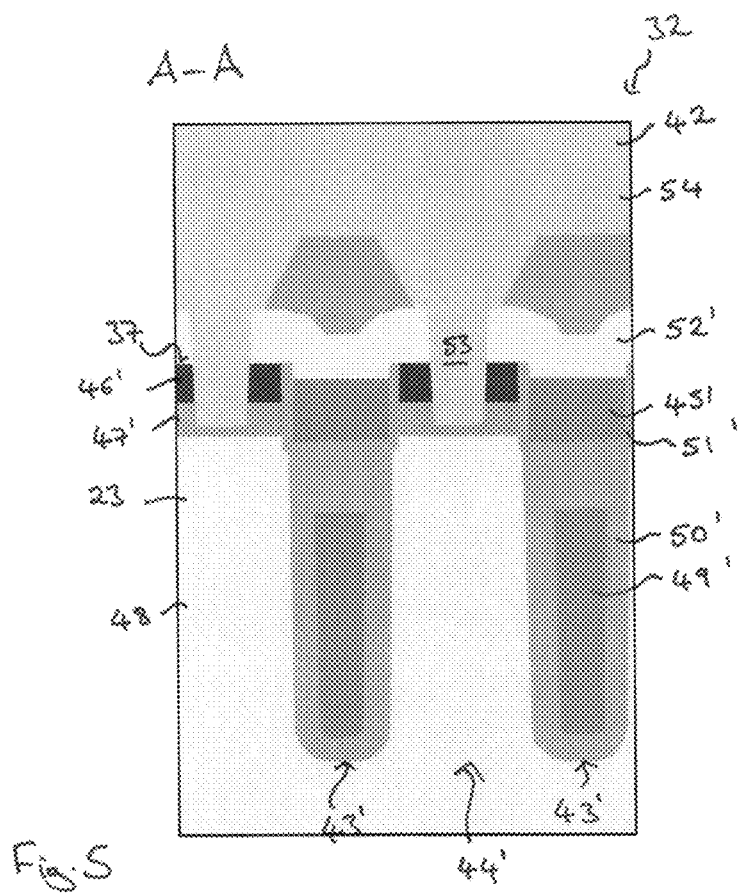
FIG. 5 illustrates a cross-sectional view of the sense transistor along the line A-A shown in FIG. 4.

FIG. 4 illustrates a plan view of an enlarged first portion of the semiconductor device of FIG. 3 and includes an enlarged plan view of the sense transistor 32 and the first bypass diode structure 33 positioned in the cutout 40 in the source pad 36. FIG. 5 illustrates a cross-sectional view along the line A-A shown in FIG. 4 and of the sense transistor 32, FIG. 6 illustrates a cross-sectional view along the line B-B shown in FIG. 4 and of the main transistor 31 and FIG. 7 illustrates a cross-sectional view along the line C-C shown in FIG. 4 and of the first bypass diode structure 33.

As discussed above, the main transistor 31 and the sense transistor 32 are typically formed using the same design rules so that the main transistor cells and the sense transistor cells have the same structure. One or all of the bypass diode structures 33, 34 may also be formed using these same design rules. In the description referring to FIGS. 3 to 7, the same reference signs will be used for features found in both the main transistor 31, the sense transistor 32 and the bypass diode structures 33, 34, whereby an element of the sense transistor 32 is indicated by a prime "'" and of the bypass diode structure 33 by a double prime "''".

In some embodiments, the main transistor 31 and the sense transistor 32 are trench transistor devices in which the trenches 43 are elongate and have a striped or strip form in plan view as can be seen in the enlarged plan view of FIG. 4. The elongate trenches 43 define and are separated from one another by common elongate mesas 44.

Figure 6:
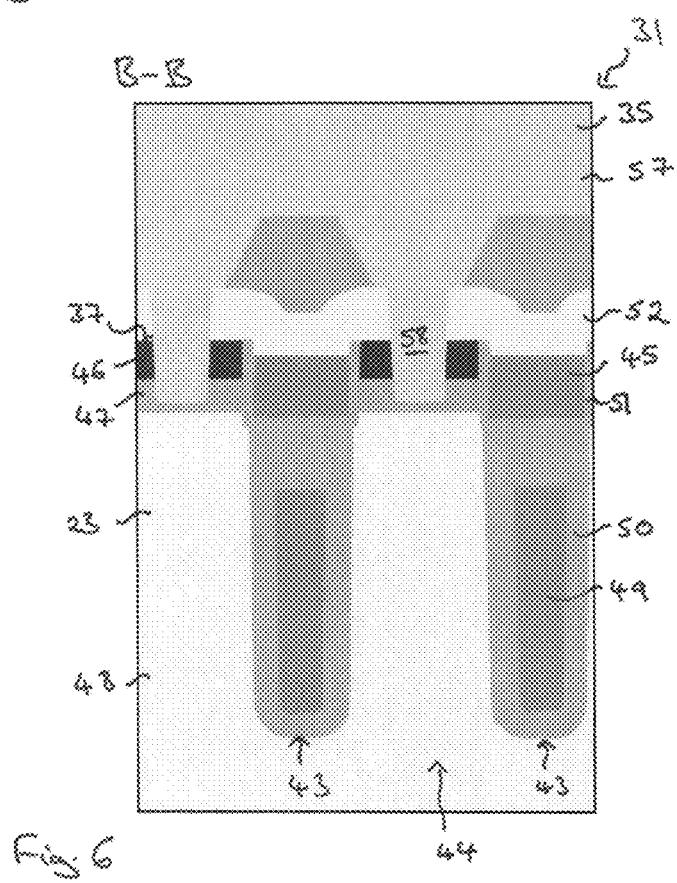
FIG. 6 illustrates a cross-sectional view of the main transistor along the line B-B shown in FIG. 4.
Figure 7:
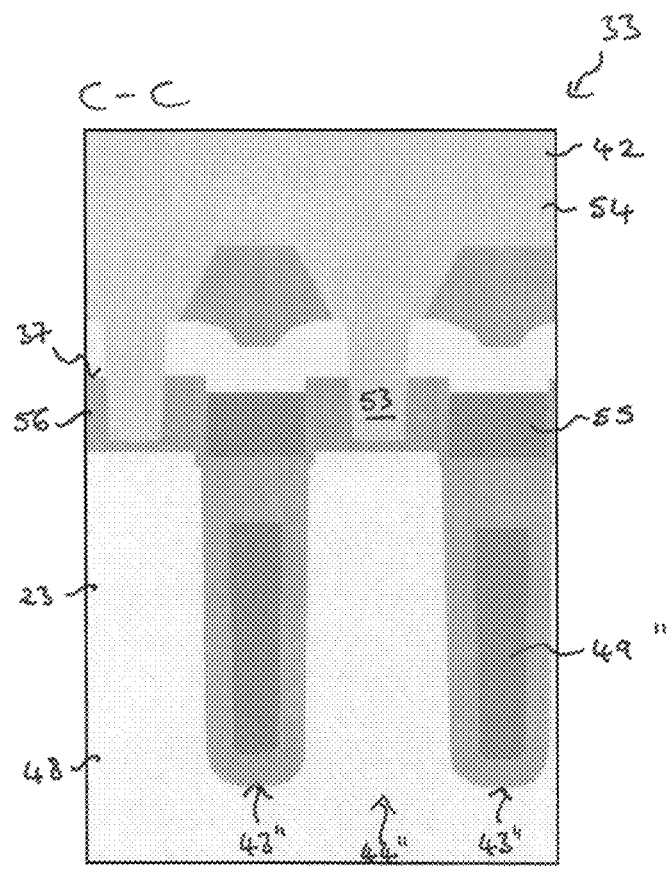
FIG. 7 illustrates a cross-sectional view of the bypass diode structure along the line C-C shown in FIG. 4.

The main transistor 31 includes a plurality of main transistor cells, each main transistor cell comprising a main trench 43 and a main mesa 44, as can be seen in FIG. 6. Each main trench 43 includes a main gate electrode 45 and each main mesa 44 comprises a main source region 46 arranged on a main body region 47 which is arranged on a drift region 48.

Similarly, the sense transistor 32 comprises a plurality of sense transistor cells, each sense transistor cell comprising a sense trench 43' and a sense mesa 44' as can be seen in FIG. 6. The bypass diode structure 33 also comprises a plurality of bypass diode trenches 43" and bypass diode mesas 44" as can be seen in FIG. 7.

In the embodiments described with reference to FIGS. 3 to 7, the main transistor 31, sense transistor 32 and the first bypass diode structure 33 are formed in different lateral regions of a common trench 43 that defines a common mesa 44.

As can be seen in the top view of FIG. 4, the first bypass diode structure 33 is positioned laterally adjacent the sense transistor 32. The sense transistor 21 and the first bypass diode structure 33 are positioned under the distal end of the source sense runner 42 within the cutout 40 of the source pad 35.

FIG. 5 illustrates a cross-sectional view along the line A-A indicated in FIG. 4 and illustrates a cross-sectional view of the sense transistor 32. FIG. 5 illustrates two sense trenches 43' which are separated by a sense mesa 44'. In some embodiments, such as that illustrated in FIGS. 3 to 7, the sense trenches 43' and sense mesas 44' are elongate and have a strip type shape in plan view. Each sense trench 43' comprises a sense gate electrode 45' and each sense mesa 44' includes a sense source region 46' arranged on a sense body region 47' which is in turn arranged on the drift region 48. The drift region 48 comprises the first conductivity type, the sense body region 47' comprises a second conductivity type, which opposes the first conductivity type, and the sense source region 46' comprises the first conductivity type. The first conductivity type may be n-type and the second conductivity may be p-type or vice versa. The sense source region 46' is more heavily doped than the drift region 48.

FIG. 6 illustrates a cross-sectional view along the line B-B indicated in FIG. 4 and illustrates a cross-sectional view of the main transistor 31. FIG. 6 illustrates two main trenches 43 which are separated by a main mesa 44. The sense trench 43' and the main trench 43 form a single common trench and the sense mesa 44' and main mesa 44 form a single common mesa as can be seen in the top view of FIG. 4.

Each main trench 43 comprises a main gate electrode 45 and each main mesa 44 includes a main source region 46 arranged on a main body region 47 which is in turn arranged on the drift region 48. The main body region 47' comprises the second conductivity type and the sense source region 46 comprises the first conductivity type. The main gate electrode 45 and the sense gate electrode 45' are coupled to one another and to the gate pad 36 by means of one or both of the gate runners 38, 39. The main drain and sense drain are coupled to a common drain arranged on the second surface of the semiconductor body, which cannot be seen in the cross-sectional views of FIGS. 5 to 7.

Whilst the cross-sectional view of the main transistor device 31 corresponds to that illustrated in FIG. 5 for the sense transistor 32, the source sense region 46' of the sense transistor 32 is electrically isolated from the source sense region 46 of the main transistor 31 so that the sense transistor 32 can detect the current flowing in the load path of the main transistor 31.

In some embodiments, the sense trenches 43' and main trenches 43 include a field plate 49, 49' which is positioned towards the bottom of the trench 43, 43' and which is spaced apart and electrically isolated from the gate electrode 45, 45' which is arranged towards the top of the trench 43, 43'. The trench 43, 43' is lined with insulating material 50, 50' which electrically insulates the field plate 49, 49' from the drift region 48 and from the gate electrode 45, 45'. The gate electrode 45, 45' is electrically insulated from the body region 47, 47' and source region 46, 46' by an insulating layer 51, 51' lining the sidewalls of the trench which acts as a gate oxide. At the position of the main transistor 31 illustrated in FIG. 5 and of the sense transistor 32 illustrated in FIG. 6, the trenches 43, 43' and gate electrode 45, 45' are covered with an electrically insulating layer 52, 52'. (Note: 52 and 52' are missing in the drawings.)

As can be seen in FIG. 5, a contact in the form of a conductive via 53 is positioned in the sense mesa 44'. The conductive via 53 extends through the sense source region 46' into the sense body region 47 and has a base positioned within the sense body region 47. The conductive vias 53 are electrically coupled with an overlying conductive layer 54 which may include one or more metal layers. The conductive layer 54 may include two or more metallic layers and may be formed by the sense runner 42. The conductive vias 53 are not connected to the main source 46 of the main transistor 31.

As can be seen in FIG. 6, the main source 46 and main body 47 are electrically connected to a conductive layer 57 by a conductive via 58. The conductive layer 57 may include one or more metallic layers and may be formed by the source pad 35. The conductive layer 57 is electrically isolated from the conductive layer 54 as the main source 46 is not electrically connected to the sense source 46'. The conductive via 58 is also electrically isolated from the conductive via 53 as the main source 46 is not electrically connected to the sense source 46'.

FIG. 7 illustrates a cross-sectional view along the line C-C of FIG. 4 and, therefore, a cross-sectional view of the first bypass diode structure 33. The first bypass diode structure 33 comprises a plurality of bypass diode trenches 43" and bypass diode mesas 44". The bypass diode trenches 43" form a common trench with the sense trenches 43 and main trenches 43 and bypass diode mesas 44" form a common mesa 44 with the sense mesas 44' and main mesas 44 as can be seen in the top view of FIG. 4. The bypass diode structure 33 is arranged laterally adjacent and contiguous to the sense transistor 31 and is arranged between the sense transistor 32 and the sense runner 42.

Each bypass diode mesa 44" comprises a bypass body region 56 positioned on the drift region 48. The bypass body region 56 extends to the first surface 37 so that the first bypass diode structure 33 does not include a source region positioned on the body region 56. The bypass body region 56 is electrically coupled to the sense source region 46' of the sense transistor 32. The bypass body region 56 and the sense source region 46' of the sense transistor 32 are electrically coupled to one another by the one or more conductive vias 53 and the metal layer 54.

As discussed above, the bypass diode structure 33 may be formed in a lateral portion of the common trench and common mesa along with the sense transistor 32 and the main transistor 31. As can be seen in the top view of FIG. 4, the first bypass diode structure 33 is arranged laterally adjacent to the sense transistor 32 and is contiguous to the sense transistor 32. Consequently, the conductive via 53 extends along the common trench 43 from the region in which the sense transistor 32 is formed to the region in which the bypass diode structure 33 is formed and the metal layer 54 extends from the bypass diode structure 33 to the sense transistor 32 thus enabling the same common conductive via 53 and the same common metal layer 54 to electrically connect the body region 56 of the bypass diode structure 33 to the source region 46 of the sense transistor structure 32.

The position and lateral form, in particular the length, of the elongate conductive via 53 may be selected so as to provide a desired contact area between the bypass body region 56 and the common metal layer 54 and a desired contact area between the source sense region 46 and the common metal layer 54. In some embodiments, the contact area between the bypass body region 56 and the common metal layer 54 is greater than the contact area between the source sense region 46 and the common metal layer 54.

In some embodiments, the elongate conductive via 53 extends laterally from the sense source transistor 32 into the bypass body region 56 by a distance of at least 10 µm, i.e. extends from the periphery of the sense source region 46 into the bypass body region 56 by a distance of at least 10 µm. This distance provides a contact area between the bypass body region 56 and the metal layer 54 that is not only larger than the contact area between the sense source region 4 and the metal layer 54 but is also larger than the typical contact area between a mesa of a transistor device and an overlying metal layer.

In some embodiments, the common trenches 43 extend to and are positioned under the gate runner 38 so that the gate electrodes 45' of the sense trenches 43' and the gate electrode 45' in the main trenches 43 can be electrically coupled to the gate runner 42. For example, a vertical contact may extend between the gate runner 42 and each of the gate electrodes 45 in the trenches 43. In common trench embodiments, such as that illustrated in FIGS. 3 to 7, the gate electrode 45' in the sense trench 43' and the gate electrode 45 in the main trench 43 may be formed by a single common conductive electrode.

As can be seen in FIG. 7, each bypass diode trench 43" comprises a first electrode 55. This first electrode 55 forms a common electrode with the sense gate electrode 45' and the main gate electrode 45. The first electrode 55 enables the sense gate electrode 45' and the main gate electrode 45 to be connected to the gate runner 38.

In some embodiments, the common metal layer 54 forms the source sense runner 42 illustrated in FIG. 3 that laterally extends between the sense transistor 32 and the sense pad 41 and over the first bypass diode structure 33. The source sense runner 42 electrically couples the source sense region 46 and the bypass body region 56 of the bypass diode structure 33 to the sense pad 41.

Figure 8:
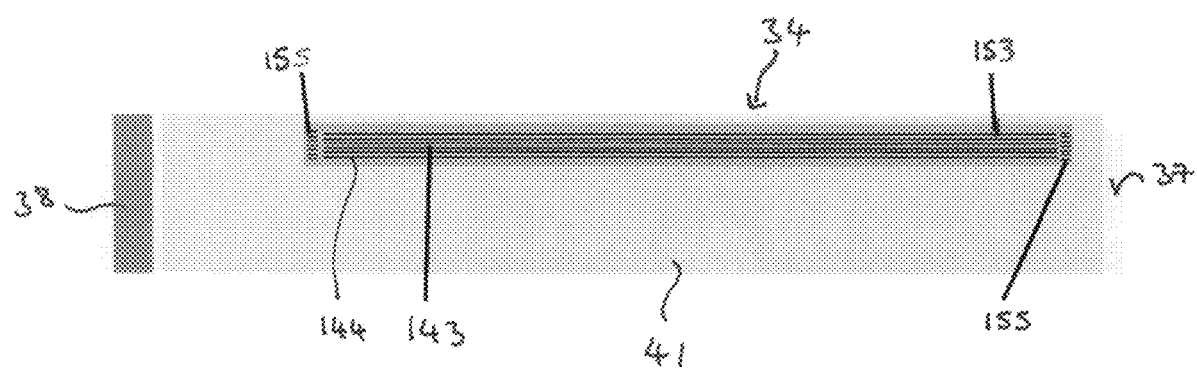
FIG. 8 illustrates an enlarged view of a second portion of the semiconductor device of FIG. 3 and illustrates a second bypass diode structure.

FIG. 8 illustrates a top view of the second bypass diode structure 34 which is arranged under the source pad 41. The structure of the second bypass diode structure 32 may be substantially the same as the structure of the first bypass diode 33 illustrated in FIG. 7.

The second bypass diode 34 comprises a plurality of bypass diode trenches 143 and a plurality of bypass diode mesas 144, that each extend between two adjacent bypass diode trenches 143. The bypass diode trenches 143 and bypass diode mesas 144 may be elongate as seen in FIG. 8. The bypass diode trench 143 may form a common trench with the main trench 43 of the main transistor 31 and the bypass diode mesa 144 may form a common mesa with the main mesa 44 of the main transistor 31. These bypass trenches 143 and mesas 144, however, do not form a common trench and mesa, respectively, with a sense transistor. The body region of the second bypass diode 34 is electrically coupled to the sense pad 41 by elongate contacts 153 that extend between the body region in the mesas 144 and the overlying sense pad 41, as shown in FIG. 8.

The second bypass diode 34 is electrically coupled in parallel with the sense transistor 32 since the body region of the second bypass diode 34 is electrically coupled to the sense pad 41, to which the sense source region 46' of the sense transistor 31 is also coupled, and the cathode of the second bypass structure 34 is also coupled to the sense drain of the sense transistor 31 and the main drain of the main transistor on the lower surface of the semiconductor body 23. The second bypass diode structure 34 is, therefore, also coupled in parallel with the first bypass diode structure 33.

In the second bypass diode a gate electrode 145, that may be arranged in the bypass diode trench 143, is electrically coupled to the overlying sense pad 41 by contacts 155 that are arranged laterally adjacent the ends of the contacts 153 electrically coupling the body region to the sense pad 41, to form a gated MOS structure. The second bypass diode structure 34 may also include a source region on top of the body region that is also coupled to the overlying sense pad 41 by the elongate contacts 153.

To summarise, a bypass for unwanted charges is provided in order to avoid spurious turn-on of the sense transistor. Additionally, avalanche ruggedness and the ESD rating are improved due to the additional area of the bypass diode(s) coupled in parallel with the sense transistor. The body region of the bypass diodes is in contact with the sense runner forming the connection to source of the sense transistor. Displacement currents are bypassed, so that the sense transistor does not turn on during a fast VDS rise. In an avalanche/ESD event most of the current will flow through the bypass diodes as its area is much bigger than the sense transistor area.

The bypass diode structure(s) coupled in parallel with the sense transistor has properties as similar as possible to the sense transistor but no MOSFET channel. As the connecting area is similar to the sense transistor, no unwanted charge will flow into the sense transistor, so that it is not influenced by the environment. This can be accomplished by designing an effectively laterally larger sense transistor including the contact to the metal on top, but implanting the source doping only at a smaller area of this larger sense transistor needed for the desired KILIS ratio. The remainder of the larger sense transistor does not include the source region, only the body region and provides the bypass diode structure. This structure enables the same gate-drain, gate-body and drain-body capacitances to be formed and the pn-diode to be connected.

A bypass function for displacement currents during fast voltage changes is provided by the extended contacts provided in the mesas that extend from the sense transistor to the bypass diode structure. A minimum length of the extended mesa contacts may be 10 µm. Also, in case of an ESD event, a larger area can be used for the resultant avalanche current reducing the current density in the sense transistor.

The bypass diode structure illustrated in FIG. 7 provides a diode having the same breakdown voltage and may be positioned at a different location on the semiconductor device, for instance under the sense pad with which the sense transistor is connected to the leadframe or a bondwire, as illustrated in FIG. 8 for example. In such a case, the bypass diode structure maintains the bypass function for the ESD event. Furthermore, if the resistance between the bypass diode and the sense transistor is sufficiently large, during an ESD event a voltage drop across the series resistance will reduce the current density in the sense transistor area further protecting the sense cell.

A current mirror power stage with an exposed sense transistor, i.e. an externally contactable sense transistor, is provided that has improved ESD ruggedness. Such a current mirror power stage may be provided in a QFN package. At least one bypass diode in parallel to the sense transistor is used to improve ESD and avalanche ruggedness and to avoid that displacement currents charge the sense transistor. Also, spurious turn-on of the sense transistor is avoided thus improving long-term current sense accuracy. As a result, the current measurement in the power stage is more reliable. This enables applications, such as computer systems, using such parts to be operated closer to their thermal limits.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a main transistor having a load path;
a sense transistor configured to sense a main current flowing in the load path of the main transistor; and
a bypass diode structure configured to protect the sense transistor and electrically coupled in parallel with the sense transistor,
wherein a sense transistor cell of the sense transistor comprises a sense trench and a sense mesa,
wherein the sense trench and a bypass diode trench of the bypass diode structure form a common trench,
wherein the sense mesa and a bypass diode mesa of the bypass diode structure form a common mesa.

2. The semiconductor device of claim 1, wherein a main trench of the main transistor cell and the sense trench each comprise a field plate that is electrically isolated from a gate electrode.

3. The semiconductor device of claim 1, wherein the sense trench extends to a gate runner, and wherein a gate electrode of the sense trench is coupled to the gate runner.

4. The semiconductor device of claim 3, wherein the bypass diode structure is laterally arranged between the sense transistor and the gate runner.

5. The semiconductor device of claim 1, wherein the main transistor comprises a main drain, wherein the sense transistor comprises a sense drain, and wherein the main drain and the sense drain are electrically coupled to one another.

6. The semiconductor device of claim 5, wherein the bypass diode structure is electrically coupled between the sense drain and a sense source region in the sense mesa.

7. The semiconductor device of claim 1, wherein a main trench of the main transistor cell comprises a main gate electrode, wherein a main mesa of the main transistor cell comprises a main source region arranged on a main body region, wherein the sense trench comprises a sense gate electrode, wherein the sense mesa comprises a sense source region arranged on a sense body region, and wherein the sense source region is electrically isolated from the main source region.

8. The semiconductor device of claim 7, wherein the bypass diode mesa comprises a bypass body region coupled to the sense source region of the sense transistor, and wherein the bypass body region extends to an upper surface of the bypass diode mesa.

9. The semiconductor device of claim 8, wherein the bypass body region and the sense source region are electrically coupled to a common metal layer by one or more conductive vias.

10. The semiconductor device of claim 9, wherein a contact area between the bypass body region and the common metal layer is greater than a contact area between the source sense region and the common metal layer.

11. The semiconductor device of claim 8, wherein an elongate conductive via is positioned in the common mesa and is positioned in the sense source region and in the bypass body region to electrically couple the sense source region and the bypass body region to the common metal layer.

12. The semiconductor device of claim 8, wherein the sense trench extends to a gate runner, and wherein the sense gate electrode of the sense trench is coupled to the gate runner.

13. The semiconductor device of claim 12, wherein the bypass diode structure is laterally arranged between the sense transistor and the gate runner.

14. The semiconductor device of claim 9, wherein the common metal layer forms a source sense runner that laterally extends between the sense transistor and a sense pad and electrically couples the sense source region and the bypass body region to the sense pad.

15. The semiconductor device of claim 14, wherein the bypass diode structure is arranged under the sense source runner or under the sense pad.

16. The semiconductor device of claim 7, wherein the main trench further comprises a field plate that is electrically isolated from the main gate electrode, and wherein the sense trench further comprises a field plate that is electrically isolated from the source gate electrode.

17. The semiconductor device of claim 1, wherein a main trench of the main transistor cell and the sense trench form a single common trench.

18. The semiconductor device of claim 1, wherein a main mesa of the main transistor cell and the sense mesa form a single common mesa.

19. The semiconductor device of claim 1, wherein the sense trench and the bypass diode trench form a single common trench.

20. The semiconductor device of claim 1, wherein the sense mesa and the bypass diode mesa form a single common mesa.

* * * * *